US008166234B2

(12) United States Patent
Jang et al.

(10) Patent No.: US 8,166,234 B2
(45) Date of Patent: Apr. 24, 2012

(54) METHOD OF FABRICATING SYSTEMS INCLUDING HEAT-SENSITIVE MEMORY DEVICES

(75) Inventors: Jun-Ho Jang, Seoul (KR); Woonjae Chung, Gunpo-si (KR); Hungjun An, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 377 days.

(21) Appl. No.: 12/631,267

(22) Filed: Dec. 4, 2009

(65) Prior Publication Data

US 2010/0153628 A1 Jun. 17, 2010

(30) Foreign Application Priority Data

Dec. 15, 2008 (KR) ........................ 10-2008-0127440

(51) Int. Cl.
*G06F 13/00* (2006.01)
(52) U.S. Cl. ........ 711/103; 711/154; 711/156; 711/170; 713/2; 713/100; 365/49.13; 365/100; 365/145; 365/148; 365/158
(58) Field of Classification Search .................. 711/103, 711/154, 156, 170; 365/49.13, 100, 145, 365/148, 158; 713/2, 100
See application file for complete search history.

(56) References Cited

U.S. PATENT DOCUMENTS

| 7,353,324 | B2* | 4/2008 | Tanaka | 711/103 |
|---|---|---|---|---|
| 7,502,252 | B2* | 3/2009 | Fuji et al. | 365/163 |
| 7,958,287 | B2* | 6/2011 | Tanaka | 710/66 |
| 2004/0130939 | A1* | 7/2004 | Morikawa | 365/158 |
| 2004/0151023 | A1 | 8/2004 | Khouri et al. | |
| 2008/0158941 | A1* | 7/2008 | Choi et al. | 365/163 |
| 2009/0172308 | A1* | 7/2009 | Prins et al. | 711/154 |
| 2009/0182933 | A1* | 7/2009 | Jang et al. | 711/103 |

FOREIGN PATENT DOCUMENTS

| KR | 1020050107199 A | 11/2005 |
|---|---|---|
| KR | 1020060051133 A | 5/2006 |

* cited by examiner

*Primary Examiner* — Stephen Elmore
(74) *Attorney, Agent, or Firm* — Myers Bigel Sibley & Sajovec, P.A.

(57) ABSTRACT

A system code is stored in a first nonvolatile memory. The first nonvolatile memory and a second nonvolatile memory are heated during assembly of an electronic device including the first nonvolatile memory and a second nonvolatile memory. The heating is to a temperature sufficient to change a state of at least some memory cells in the second nonvolatile memory device. After the heating, the system code stored in the first nonvolatile memory is copied into the second nonvolatile memory. The first nonvolatile memory may be less vulnerable to temperature-related data alteration than the second nonvolatile memory. For example, the first nonvolatile memory may include a NAND flash memory and the second nonvolatile memory may include a variable resistance memory.

14 Claims, 5 Drawing Sheets

METHOD OF FABRICATING SYSTEMS INCLUDING HEAT-SENSITIVE MEMORY DEVICES

REFERENCE TO PRIORITY APPLICATION

This application claims priority to Korean Patent Application 10-2008-127440, filed Dec. 15, 2008, the contents of which are hereby incorporated herein by reference.

FIELD OF THE INVENTION

The present invention relates to electronic systems and, more particularly, to methods of fabricating electronic systems including memory devices.

BACKGROUND

Semiconductor memory devices are used to store data, and may be classified as volatile memory devices and nonvolatile memory devices. Volatile memory devices lose stored data when power supply is interrupted, while nonvolatile memory devices do not.

Because nonvolatile memory devices typically can store data with relatively low power consumption, nonvolatile memory devices are commonly used as a storage medium for mobile devices. Examples of nonvolatile memory devices include flash memory devices and variable resistance memory devices.

Examples of variable resistance memory devices include ferroelectric RAMs (FRAMs) using ferroelectric capacitors, magnetic RAMs (MRAMs) using tunneling magneto-resistive (TMR) films, and phase change memory devices using chalcogenide alloys. Phase change memory devices may be fabricated using relatively simple manufacturing processes and can provide relatively large memory capacity at a relatively low cost.

Variable resistance memory devices may be affected by heat. For example, when a variable resistance memory device is exposed to a high temperature for a long time, stored data may be lost. This can reduce reliability of a memory system using such devices.

SUMMARY

Some embodiments of the present invention provide methods of fabricating an electronic system. The methods include storing a system code in a first nonvolatile memory. The first nonvolatile memory and a second nonvolatile memory are heated during assembly of an electronic device including the first nonvolatile memory and a second nonvolatile memory. The heating is to a temperature sufficient to change a state of at least some memory cells in the second nonvolatile memory device. After the heating, the system code stored in the first nonvolatile memory is copied into the second nonvolatile memory. The first nonvolatile memory may be less vulnerable to temperature-related data alteration than the second nonvolatile memory. For example, the first nonvolatile memory may include a NAND flash memory and the second nonvolatile memory may include a variable resistance memory.

According to further embodiments, the system code stored in the first nonvolatile memory may be deleted after copying the system code stored in the first nonvolatile memory into the second nonvolatile memory. Copying the system code stored in the first nonvolatile memory into the second nonvolatile memory may include copying the system code stored in the first nonvolatile memory into the second nonvolatile memory responsive to detecting absence of the system code from the second nonvolatile memory. The methods may further include updating a copy flag indicating that the system code stored in the first nonvolatile memory has been copied into the second nonvolatile memory. Copying of the system code stored in the first nonvolatile memory into the second nonvolatile memory may be foregone responsive to the copy flag indicating that the system code stored in the first nonvolatile memory is copied into the second nonvolatile memory. The system code may include data for initializing the electronic system.

According to further embodiments, copying the system code stored in the first nonvolatile memory into the second nonvolatile memory is preceded by loading a bootloader from a boot memory to a volatile memory of the electronic device and initiating execution of the loaded bootloader in a processor of the electronic device. Copying the system code stored in the first nonvolatile memory into the second nonvolatile memory includes the processor executing the bootloader to cause the system code stored in the first nonvolatile memory to be copied into the second nonvolatile memory. The methods may further include the processor executing the system code stored in the second nonvolatile memory.

Additional embodiments provide an electronic system including a first nonvolatile memory configured to store a system code, a second nonvolatile memory that is more vulnerable to temperature-related data alteration than the first nonvolatile memory and a control circuit operatively coupled to the first and second memories and configured to copy the system code stored in the first nonvolatile memory into the second nonvolatile memory. The first nonvolatile memory may include a NAND flash memory and the second nonvolatile memory may include a variable resistance memory. The control circuit may include a processor operatively coupled to the first and second nonvolatile memories, a volatile memory operatively coupled to the processor and a boot memory operatively coupled to the processor and configured to store a bootloader. The bootloader is configured to be executed by the processor to cause copying of the system code stored in the first nonvolatile memory into the second nonvolatile memory.

DETAILED DESCRIPTION

Figure 1:
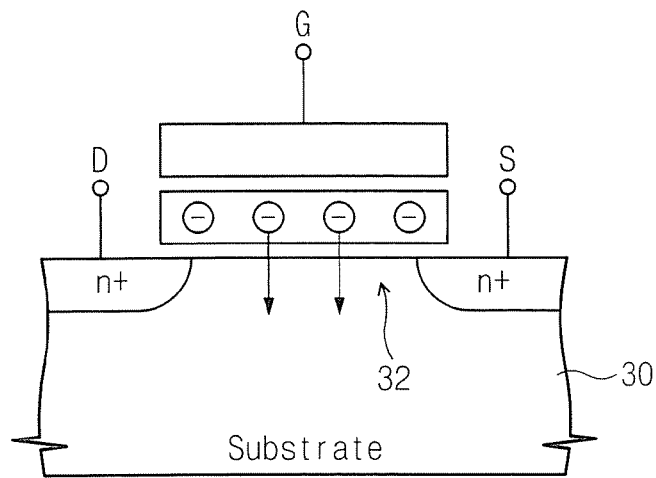
FIG. 1 is a cross sectional diagram illustrating a memory cell of a flash memory device.

It should be understood that both the foregoing description and the following detailed description are illustrative and additionally describe the claimed invention. Reference numerals are fully indicated in illustrated embodiments of the present invention. Like reference numerals refer to like elements throughout the specification.

FIG. 1 is a cross sectional diagram illustrating a memory cell of a flash memory device. Referring to FIG. 1, a source S and a drain D are formed with a channel area 32 therebetween on a semiconductor substrate 30. A floating gate FG is formed on a thin insulator film on the channel area 32. A control gate CG is formed on another insulator film on the floating gate FG. Terminals are connected to the source S, the drain D, the floating gate FG, the control gate CG, and the semiconductor substrate 30, respectively, to apply voltages required for an erasing operation and a reading operation.

In the above described flash memory device, data is read out by determining a threshold voltage of the memory cell. The threshold voltage of the memory cell is determined by the amount of electrons stored in the floating gate or charge trapping layer. The larger the amount of electrons stored in the floating gate or the charge trapping layer, the higher the threshold voltage.

Figure 2:
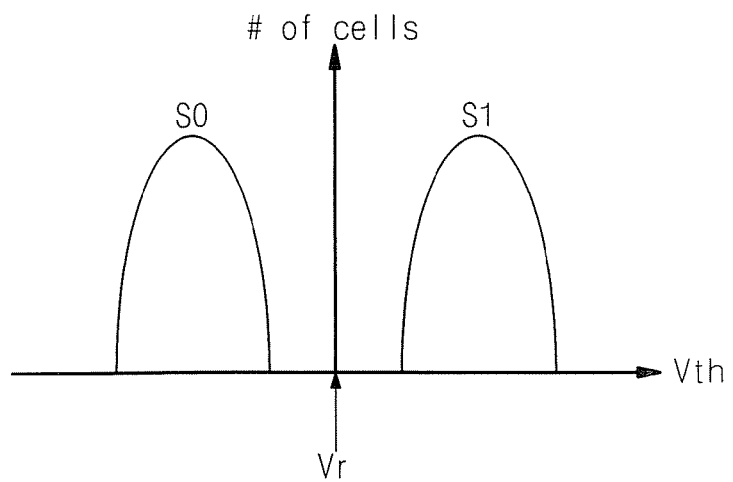
FIG. 2 is a graph illustrating a threshold voltage distribution of a flash memory device.

FIG. 2 is a graph illustrating a threshold voltage distribution of the flash memory cell. Referring to FIG. 2, an x-axis indicates a threshold voltage Vth, and a y-axis indicates the number of flash memory cells. In case of Single Level Cell (SLC), the threshold voltage of flash memory cell has one of two states ('S0' and 'S1').

When a read voltage Vr is applied to the control gate CG (see FIG. 1) of the flash memory cell, if the flash memory cell has the state S0, it is turned on. Conversely, if the cell has the state S1, it is turned off. When the flash memory cell is turned on, current is passed through the flash memory cell. When the flash memory cell is turned off, current is not passed through the flash memory cell. Accordingly, a stored data value can be determined by the presence of absence of current.

NAND flash memory devices are commonly used as storage in mobile devices, such as MP3 players and cellular phones. NAND flash memory devices generally have excellent characteristics compared to other nonvolatile memory devices in terms of integration density, write performance, life span, impact resistance and power consumption. Recently, other kinds of nonvolatile memory devices, such as variable resistance memory devices, have been produced to offer improved characteristics.

Figure 3:
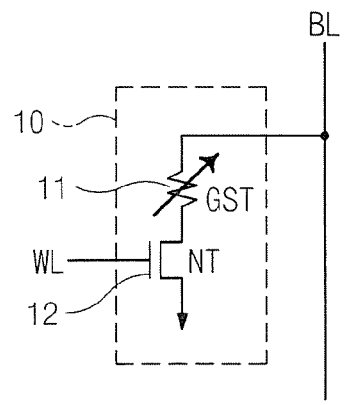
FIGS. 3 and 4 illustrate different configurations of a memory cell of a variable resistance memory device.
Figure 4:
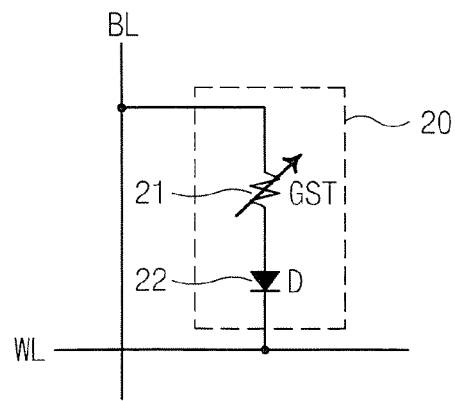

FIGS. 3 and 4 illustrate different arrangements of variable resistance memory device cells. Referring FIG. 3, a memory cell 10 includes a memory element 11 and a selection element 12. The memory element 11 is connected between a bit line BL and the selection element 12, and the selection element 12 is connected between the memory element 11 and a ground.

The memory element 11 includes a variable resistance material GST. The variable resistance material GST is a material such as Ge—Sb—Te that varies in resistance according to temperature. The variable resistance material GST may take either of two stable states having different resistances, for example, a crystalline state and an amorphous state, according to the temperature. The variable resistance material GST may be changed into the crystalline state or the amorphous state responsive to heat-generating currents supplied through the bit line BL. A variable resistance memory device stores data by using these characteristics of the variable resistance material GST.

As illustrated, the select element 12 includes an NMOS transistor NT. A word line WL is connected to a gate of the NMOS transistor NT. When a predetermined voltage is applied to the word line WL, the NMOS transistor NT is turned on. When the NMOS transistor NT is turned on, the memory element 11 receives a current through the bit line BL.

In FIG. 3, the memory element 11 is connected between the bit line BL and the selection element 12. However, the selection element 12 may be connected between the bit line BL and the memory element 11.

Referring FIG. 4, a memory cell 20 includes a memory element 21 and a selection element 22. The memory element 21 is connected between a bit line BL and the selection element 22, and the selection element 22 is connected between the memory element 21 and a ground. The memory element 21 may be the same as the memory element 11 of FIG. 1.

The selection element 22 includes a diode D. The memory element 21 is connected to an anode of the diode D, and a word line WL is connected to a cathode of the diode D. When a voltage difference between the anode and the cathode of the diode D becomes higher than a threshold voltage of the diode D, the diode D is turned on. When the diode D is turned on, a current is supplied to the memory element 21 through the bit line BL.

Figure 5:
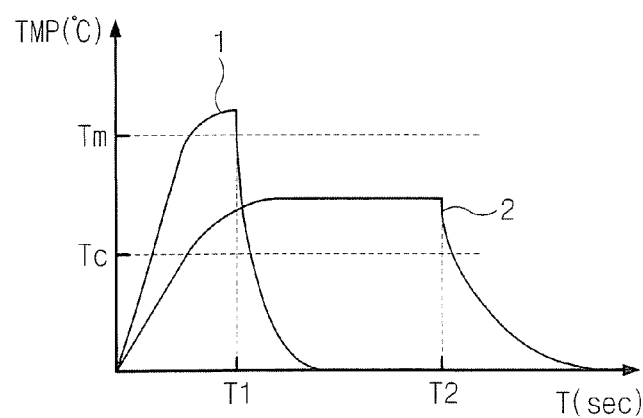
FIG. 5 is a graph illustrating characteristics of variable resistance material GST used in the variable resistance memory devices illustrated in FIGS. 3 and 4.

FIG. 5 is a graph illustrating characteristics of the variable resistance material GST illustrated in FIGS. 3 and 4. In FIG. 5, a process 1 is a process in which the variable resistance material GST transitions to an amorphous state, and process 2 is a process in which the variable resistance material GST transitions to a crystalline state.

When the variable resistance material GST is heated to a temperature above a melting temperature Tm for time T1 and then quenched, the variable resistance material GST transitions to the amorphous state. The amorphous state is generally called a reset state, which may correspond to a data value of "1". The variable resistance memory device provides a reset current to the variable resistance material GST so as to program at the reset state.

When the variable resistance material GST is heated to a temperature above a crystallization temperature Tc and below a melting temperature Tm for time T2 longer than T1 and slowly cooled, the variable resistance material GST transitions to the crystalline state. The crystalline state is generally called a set state, which may correspond to a data value "0". The variable resistance memory device provides a set current to the variable resistance material GST so as to program at the set state.

Because variable resistance memories with high integration density may be affected by heat, there may be a loss of stored data due to exposure to high temperatures. Such data loss may not occur in general use environments, but may occur during assembly of an electronic device that includes the variable resistance memory. For example, when a variable resistance memory is being attached to a substrate, it may be exposed to a high temperature for a long period of time. This may cause the loss of bootloaders, operating systems, system files, and the like, resulting in an increase in defects.

To address this problem, techniques have been proposed wherein system code is loaded into in the variable resistance memory after assembly using a special-purpose fixture to avoid thermal influences when the electronic system is being assembled. However, potential disadvantages of this technique include the need to provide an interface between the system and the special-purpose fixture.

Some embodiments of the present invention arise from a realization that system code may be first stored in a NAND flash memory (or other relatively heat-insensitive nonvolatile memory) of an electronic system that includes a heat-vulnerable memory, such as a variable resistance memory. The system code may be transferred to the heat-vulnerable variable resistance memory after assembly.

Figure 6:
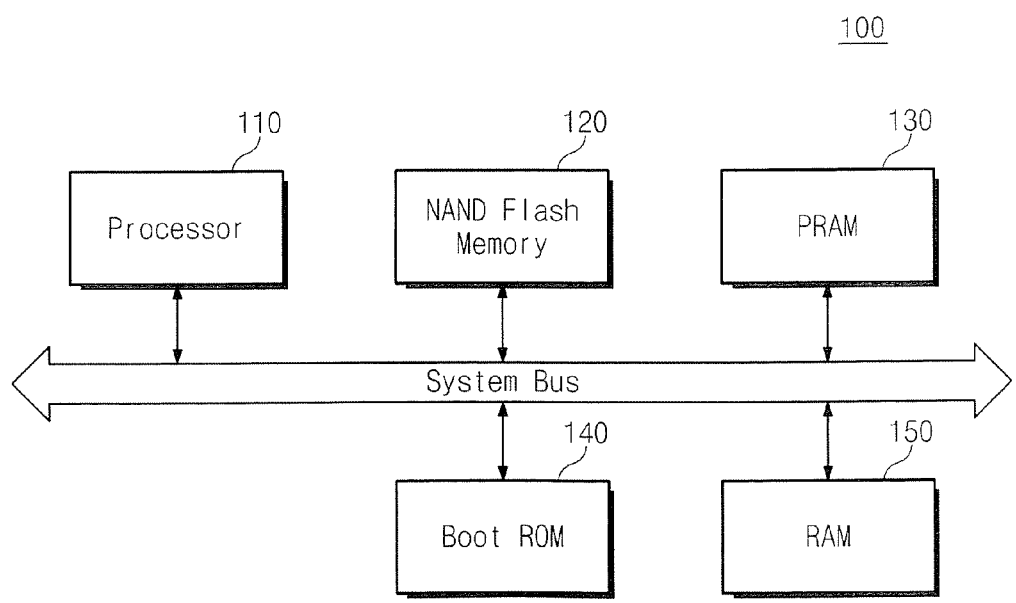
FIG. 6 is a block diagram illustrating a electronic system according to some embodiments of the present invention.

FIG. 6 is a block diagram illustrating a system according to some embodiments of the present invention. Referring FIG. 6, the system 100 includes a processor 110, a NAND flash memory 120, a variable resistance memory 130, a boot ROM 140, and a RAM 150.

The processor 110 controls operations of the system 100. For example, the processor 110 may process a program stored in the RAM 150. The NAND flash memory 120 may store a system code. In addition, the NAND flash memory 120 may store user data such as music, moving pictures, and documents. The system code stored in the NAND flash memory 120 will be copied into the variable resistance memory 130.

The boot ROM 140 controls the operation required for booting the electronic system 100. For example, the boot ROM 140 may allow the bootloader to be loaded into the RAM 150. The bootloader is executed in advance before the operating system is driven. The operating system is a program that finishes a process required for rightly starting up a kernel and starts up the operating system, finally. The RAM 150 is used as a main storage unit. The program loaded into the RAM 150 may be performed by the processor.

The NAND flash memory 120 may configure a memory card or a solid state drive. Furthermore, the processor 110 and the RAM 150 may configure a host. For example, the system 100 may be used in a mobile media player such as an MP3 player, PMP, or notebook computer. The processing results of the processor 110 may be stored in the NAND flash memory 120, variable resistance memory 130, and RAM 150. A power supply unit may supply power for the system 100. If the system 100 is in a mobile device, a battery may supply power for the system 100.

Figure 7:
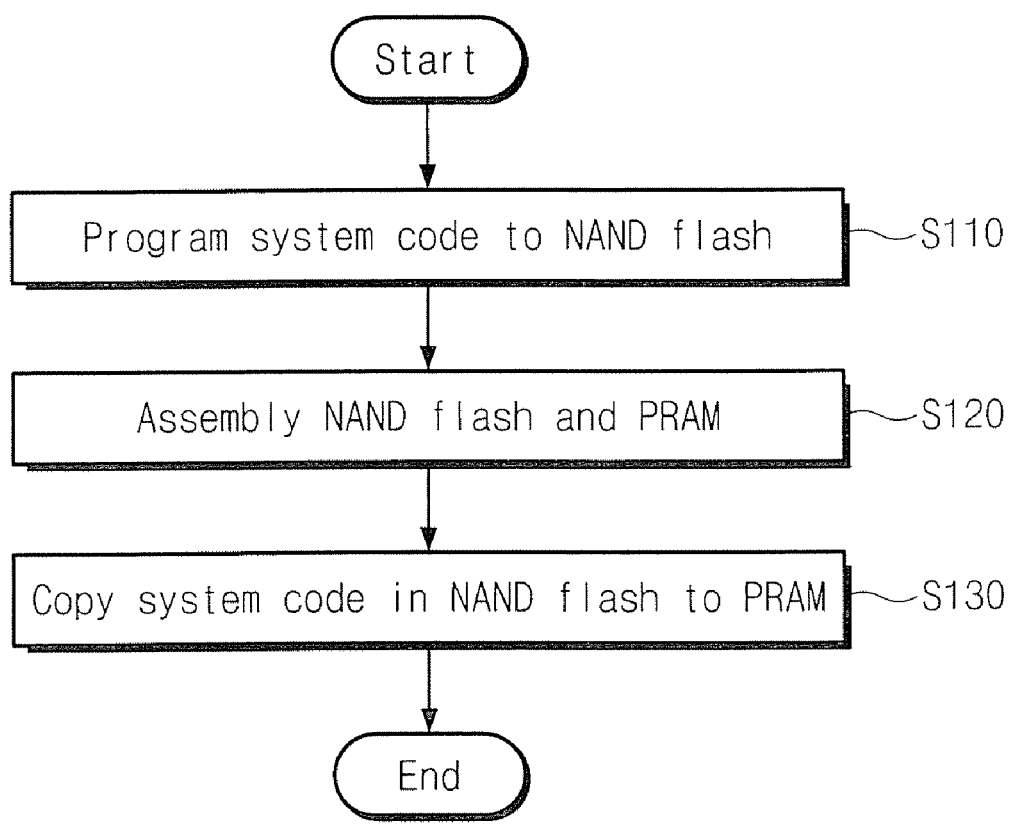
FIG. 7 is a flowchart illustrating operations for fabricating a memory system according to some embodiments of the present invention.

FIG. 7 is a flowchart illustrating operations for a system according to some embodiments of the present invention. Referring to FIG. 7, system code is stored in the NAND flash memory (block S110). The system code is used for initializing the electronic system. For example, the system code may support a file system, device driver and operating system. For example, in a personal computer or a mobile device that uses a storage device such as a solid state drive or a hard disk, a file system may be required. The file system may be a structure or software to be used for storing data in the storage device. A device driver may be a computer program that controls interaction of the system 100 with peripheral devices. The device driver controls the hardware and serves as an intermediate bridge of the program that uses the hardware and peripheral units.

Referring, again to FIG. 7, the NAND flash memory and the variable resistance memory are assembled on the substrate (block S120). In assembling, heat may be applied to the NAND flash memory and variable resistance memory. However, because the NAND flash memory is relatively resistant to heat, the data stored in the NAND flash memory may not be affected.

After the NAND flash memory and the variable resistance memory are assembled, the system code stored in the NAND flash memory is stored in the variable resistance memory (block S130). Operations for transferring system code stored in the NAND flash memory to the variable resistance memory will be described more fully with reference to FIG. 8. Because the system code is stored in the variable resistance memory after the NAND flash memory and the variable resistance memory are assembled, it can prevent the thermal loss of data in the variable resistance memory during, assembly.

Figure 8:
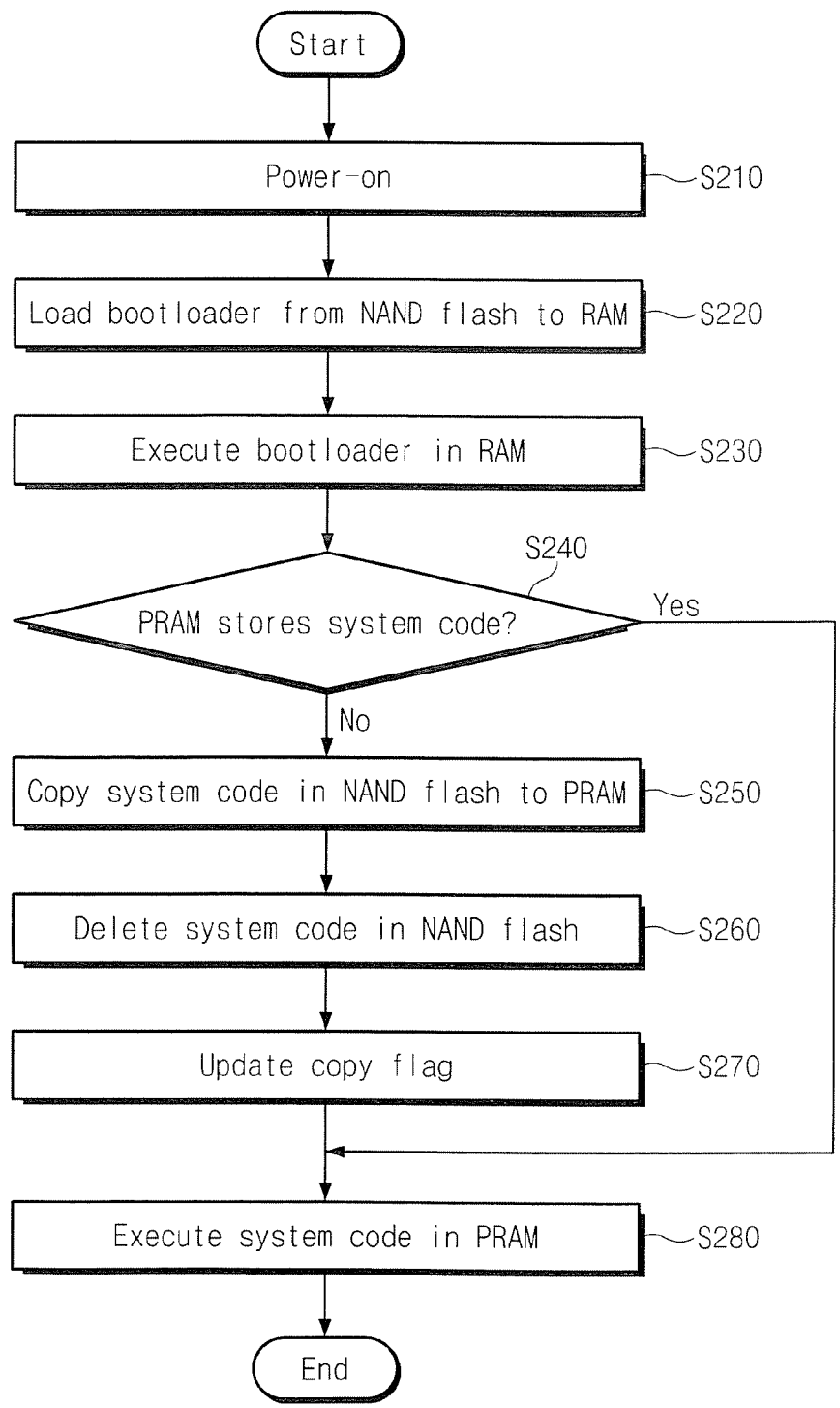
FIG. 8 is a flowchart illustrating operations of a memory system according to further embodiments of the present invention.

FIG. 8 is a flowchart illustrating operations for transferring system code of the electronic system according to some embodiments of the present invention. The system is powered up (block S210). The boot ROM causes the bootloader stored in the NAND flash memory to be loaded into the RAM (block S220). Before this, an initialization code stored in the boot ROM may initialize the NAND flash memory and the RAM. The bootloader stored in the RAM is executed (block S230).

The bootloader determines whether or not the system code is stored in the variable resistance memory (block S240). If the system code is stored in the variable resistance memory, the processor executes the system code in the variable resistance memory (block S280).

If the system code is not stored in the variable resistance memory, the system code in the NAND flash memory is copied into the variable resistance memory (block S250). The system code in the NAND flash memory is subsequently erased (block S260). As the system code is deleted, storage capacity of the NAND flash memory may be increased. The erase operations may be omitted. If not erased, it can be used if the system code stored in the variable resistance memory is lost, i.e., the system code in the NAND flash memory can be copied into the variable resistance memory once again.

A copy flag is updated (block S 270). The copy flag indicates whether or not the variable resistance memory stores the system code. The processor may use the copy flag to determine whether or not to copy the system code in the NAND flash memory into the variable resistance memory. The system code stored in the variable resistance memory may be executed to control the system.

As described above, since the system code is copied into the variable resistance memory from the NAND flash memory after assembling the system, it can reduce or prevent thermal loss of data.

A NOR flash memory can be replaced by a variable resistance memory, and the variable resistance memory can be utilized as a boot image storing space, in place of DRAM that may consume a relatively large amount of power. In other words, a variable resistance memory can be used in place of DRAM.

In the above-described embodiments, a NAND flash memory and a variable resistance memory are described, but the scope of the present invention is not limited thereto. Some embodiments of the present invention are applicable to a variety of combinations of a memory relatively tolerant of heat applied during an assembly process and memory the is relatively susceptible to heat. In particular, after storing system code in a first memory that is relatively immune to heat, a second memory relatively vulnerable to heat is assembled together with the first memory. After the first and second memories are assembled, the system code stored in the first memory may be stored in the second memory.

NAND flash memories or variable resistance memories used in various embodiments may be mounted by using various types of packages. For example, the NAND flash memory or the variable resistance memory may be mounted by using Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

A system according to some embodiments of the present invention maybe used in a Solid State Drive (SSD). SSD products are expected to replace Hard Disk Drive (HDD) product in the next-generation memory market. SSD devices are data storage devices that utilize memory chips such as a flash memory to store data instead of a disk used in HDD devices.

Compared to the mechanically operating HDD, the SSD is high speed, strong in external impact, and low power consumption. The SSD may exchange the data with the host through an ATA interface. The ATA interface includes S-ATA (serial ATA) standard and P-ATA (parallel ATA) standard.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method comprising:
 storing a system code in a first nonvolatile memory;
 heating the first nonvolatile memory device and a second nonvolatile memory device to a temperature sufficient to change a state of at least some memory cells in the second nonvolatile memory device during assembly of an electronic system comprising the first and second nonvolatile memory devices; and
 copying the system code stored in the first nonvolatile memory into the second nonvolatile memory after the heating.

2. The method of claim 1, wherein the first nonvolatile memory is less vulnerable to temperature-related data alteration than the second nonvolatile memory.

3. The method of claim 2, wherein the first nonvolatile memory comprises a NAND flash memory and wherein the second nonvolatile memory comprises a variable resistance memory.

4. The method of claim 1, further comprising deleting the system code stored in the first nonvolatile memory after copying the system code stored in the first nonvolatile memory into the second nonvolatile memory.

5. The method of claim 1, wherein copying the system code stored in the first nonvolatile memory into the second nonvolatile memory after the heating comprises copying the system code stored in the first nonvolatile memory into the second nonvolatile memory responsive to detecting absence of the system code from the second nonvolatile memory.

6. The method of claim 1, further comprising updating a copy flag indicating that the system code stored in the first nonvolatile memory has been copied into the second nonvolatile memory.

7. The method of claim 6, further comprising foregoing copying the system code stored in the first nonvolatile memory into the second nonvolatile memory responsive to the copy flag indicating that the system code stored in the first nonvolatile memory is copied into the second nonvolatile memory.

8. The method of claim 1, wherein the system code comprises data for initializing the electronic system.

9. The method of claim 1:
 wherein copying the system code stored in the first nonvolatile memory into the second nonvolatile memory is preceded by loading a bootloader from a boot memory to a volatile memory of the electronic device and initiating execution of the loaded bootloader in a processor of the electronic device; and
 wherein copying the system code stored in the first nonvolatile memory into the second nonvolatile memory comprises the processor executing the bootloader to cause the system code stored in the first nonvolatile memory to be copied into the second nonvolatile memory.

10. The method of claim 9, further comprising the processor executing the system code stored in the second nonvolatile memory.

11. An electronic system comprising:
 a first nonvolatile memory configured to store a system code;
 a second nonvolatile memory that is more vulnerable to temperature-related data alteration than the first nonvolatile memory;
 a control circuit operatively coupled to the first and second memories and configured to copy the system code stored in the first nonvolatile memory into the second nonvolatile memory.

12. The system of claim 11, wherein the first nonvolatile memory comprises a NAND flash memory and wherein the second nonvolatile memory comprises a variable resistance memory.

13. The system of claim 11, wherein the control circuit comprises:
 a processor operatively coupled to the first and second nonvolatile memories;
 a volatile memory operatively coupled to the processor; and
 a boot memory operatively coupled to the processor and configured to store a bootloader, the bootloader configured to be executed by the processor to cause copying of the system code stored in the first nonvolatile memory into the second nonvolatile memory.

14. The system of claim 11, wherein the control circuit is configured to operate the system as a solid state drive.

* * * * *